(12) United States Patent
Hwang et al.

(10) Patent No.: US 9,340,868 B2
(45) Date of Patent: May 17, 2016

(54) SPUTTERING DEVICE

(71) Applicant: SAMSUNG DISPLAY CO., LTD., Yongin, Gyeonggi-Do (KR)

(72) Inventors: Jin Ho Hwang, Osan-si (KR); Do-Hyun Kim, Seongnam-si (KR); Sang Won Shin, Yongin-si (KR); Woo Song Kim, Hwaseong-si (KR); Chang-Oh Jeong, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 281 days.

(21) Appl. No.: 13/760,758

(22) Filed: Feb. 6, 2013

(65) Prior Publication Data

US 2014/0076714 A1  Mar. 20, 2014

(30) Foreign Application Priority Data

Sep. 18, 2012  (KR) .......................... 10-2012-0103290

(51) Int. Cl.
| | |
|---|---|
| *C23C 14/34* | (2006.01) |
| *C23C 14/35* | (2006.01) |
| *H01J 37/34* | (2006.01) |
| *C23C 16/455* | (2006.01) |
| *C23C 14/00* | (2006.01) |
| *H01J 37/32* | (2006.01) |

(52) U.S. Cl.
CPC ............ *C23C 14/352* (2013.01); *C23C 14/0063* (2013.01); *C23C 14/35* (2013.01); *C23C 16/455* (2013.01); *C23C 16/45565* (2013.01); *H01J 37/3244* (2013.01); *H01J 37/32449* (2013.01); *H01J 37/32834* (2013.01); *H01J 37/3411* (2013.01); *H01J 37/3417* (2013.01); *H01J 37/3435* (2013.01); *H01J 37/3438* (2013.01)

(58) Field of Classification Search
CPC .............. H01J 37/3244; H01J 37/3411; H01J 37/3485; C23C 16/455
USPC ........................................ 204/298.06, 298.26
See application file for complete search history.

(56) References Cited

U.S. PATENT DOCUMENTS

| | | | | |
|---|---|---|---|---|
| 4,425,218 | A * | 1/1984 | Robinson ................. | 204/298.07 |
| 5,441,615 | A * | 8/1995 | Mukai et al. ............. | 204/192.12 |
| 7,166,199 | B2 * | 1/2007 | Hartig ...................... | 204/192.12 |
| 7,347,919 | B2 | 3/2008 | Sato et al. | |
| 7,708,866 | B2 * | 5/2010 | Kim et al. ................ | 204/192.12 |
| 2010/0078313 | A1 | 4/2010 | Chiba et al. | |
| 2010/0151345 | A1 | 6/2010 | Salvatore et al. | |
| 2010/0151349 | A1 | 6/2010 | Salvatore et al. | |
| 2010/0248059 | A1 | 9/2010 | Koji et al. | |
| 2010/0277050 | A1 | 11/2010 | Kishimoto et al. | |

FOREIGN PATENT DOCUMENTS

| | | |
|---|---|---|
| JP | 2004346406 A | 12/2004 |
| KR | 100509804 B1 | 8/2005 |

(Continued)

*Primary Examiner* — Jason M Berman
(74) *Attorney, Agent, or Firm* — Cantor Colburn LLP

(57) ABSTRACT

A sputtering device includes: a sputtering target; a substrate supporter facing the sputtering target and upon which a substrate is disposed; an anode mask between the sputtering target and the substrate which is on the substrate supporter; and a gas distribution member between the anode mask and the sputtering target, and including a plurality of gas distribution tubes separated from each other. Each gas distribution tube includes a plurality of discharge holes defined therein and through which gas is discharged to a vacuum chamber configured to receive the sputtering device.

20 Claims, 5 Drawing Sheets

(56) References Cited

FOREIGN PATENT DOCUMENTS

| KR | 1020050081759 A | 8/2005 |
| KR | 100672629 B1 | 1/2007 |
| KR | 1020080061911 A | 7/2008 |
| KR | 1020090026125 A | 3/2009 |

\* cited by examiner

SPUTTERING DEVICE

This application claims priority to Korean Patent Application No. 10-2012-0103290 filed on Sep. 18, 2012, and all the benefits accruing therefrom under 35 U.S.C. §119, the entire contents of which are incorporated herein by reference.

BACKGROUND (a) Field

The invention relates to a sputtering device.

(b) Description of the Related Art

As a personal computer, a television or the like has been lightened and slimmed, a display device used in the personal computer, the television or the like should be commensurately lightened and slimmed. In order to make the display device lighter and slimmer, a flat panel display such as a liquid crystal display has been developed to replace a cathode ray tube ("CRT") display of a conventional display device.

The liquid crystal display applies an electric field to a liquid crystal material having dielectric anisotropy which is between two substrates. The liquid crystal display controls the intensity of the electric field to control a quantity of light which is transmitted to one or both of the substrates, thereby acquiring a desired image signal. Since the liquid crystal display may be a portable flat panel display, a thin film transistor liquid crystal display ("TFT LCD") using a thin film transistor ("TFT") as a switching element is frequently used as the liquid crystal display.

In manufacturing a liquid crystal display, a sputtering device is one of many manufacturing devices used when a thin film (for example, a metal thin film) is deposited on a substrate for a semiconductor device or on a substrate for a liquid crystal display. The sputtering device is treated as a critical device when the semiconductor device or the liquid crystal display is manufactured.

In the sputtering device, the thin film is generally deposited by the following method. When a voltage is applied in a vacuum state and argon (Ar) gas or oxygen (O2) gas is injected, ions collide with a target while the argon (Ar) gas or the oxygen (O2) gas is ionized. In this case, atoms are discharged from the target and the discharged atoms are attached to the substrate for a semiconductor device or to the substrate for a liquid crystal display, to form the thin film.

A sputtering process may form a thin film at a relatively low temperature as compared to a chemical vapor deposition ("CVD") process which is performed at a relatively high temperature, and may form a thin film in a relatively short time and in a simple structure such that the thin film is widely used when the semiconductor device or the liquid crystal display is manufactured.

However, as a size of the substrate increases, uniformity of the thin film may undesirably deteriorate. Therefore, there remains a need for an improved sputtering device which provides a uniform thin film on a substrate even as a size of the substrate increases.

SUMMARY

One or more exemplary embodiment of the invention provides a sputtering device having an advantage of improving uniformity of a thin film.

An exemplary embodiment of the invention provides a sputtering device, including a sputtering target; a substrate supporter facing the sputtering target and upon which a substrate is disposed; an anode mask between the sputtering target and the substrate on the substrate supporter; and a gas distribution member between the anode mask and the sputtering target, and including a plurality of gas distribution tubes separated from each other, where each gas distribution tube includes a plurality of discharge holes defined therein and through which gas is discharged to a vacuum chamber configured to receive the sputtering device.

The plurality of discharge holes may be parallel to a plane of the anode mask.

The gas distribution tubes may include a plurality of rods which is separated from and parallel to each other.

The plurality of discharge holes may face the substrate.

The plurality of discharge holes may face the sputtering target.

The plurality of discharge holes may include a first discharge hole facing the sputtering target and a second discharge hole facing the substrate.

The gas discharge member may be connected with a mass inflow meter.

The sputtering device may include a plurality of sputtering targets separated from each other, and the gas distribution tubes may be respectively between adjacent sputtering targets.

The gas discharged through the gas distribution tubes and to the vacuum chamber may be reaction gas which is deposited on the substrate after reacting with a material of the sputtering target.

The reaction gas may include oxygen or nitrogen.

The sputtering device may further include a plurality of magnetrons on the sputtering target and generating a magnetic field.

The gas distribution tube may include a metal material.

The gas is discharged to the vacuum chamber substantially simultaneously.

Another exemplary embodiment of the invention provides a sputtering device, including a plurality of sputtering targets, and a hole defined between adjacent sputtering targets; a substrate supporter facing the plurality of sputtering targets, and upon which a substrate is disposed; an anode mask between the plurality of sputtering targets and the substrate which is on the substrate supporter; and a gas injection tube in communication with a space between a vacuum chamber barrier on a back side of the sputtering targets, and the sputtering targets, and from which gas is discharged. The gas discharged from the gas injection tube is injected into a reaction space between the sputtering targets and the substrate, through the hole defined between the adjacent sputtering targets.

The gas injection tube may be connected with a mass inflow meter which is positioned outside the vacuum chamber barrier.

The sputtering device may further include a plurality of magnetrons on the back side of the plurality of sputtering targets.

According to one or more exemplary embodiment of the invention, a reaction gas is uniformly distributed for plasma generation, by injecting the reaction gas through a gas distribution tube including a plurality of discharge holes corresponding to a horizontal surface (e.g., plane) of an anode mask. Therefore, a thin film formed using the plasma generation is uniform.

BRIEF DESCRIPTION OF THE DRAWINGS

The above and other features of this disclosure will become more apparent by describing in further detail, exemplary embodiments thereof with reference to the accompanying drawings, in which.

DETAILED DESCRIPTION

Figure 1:
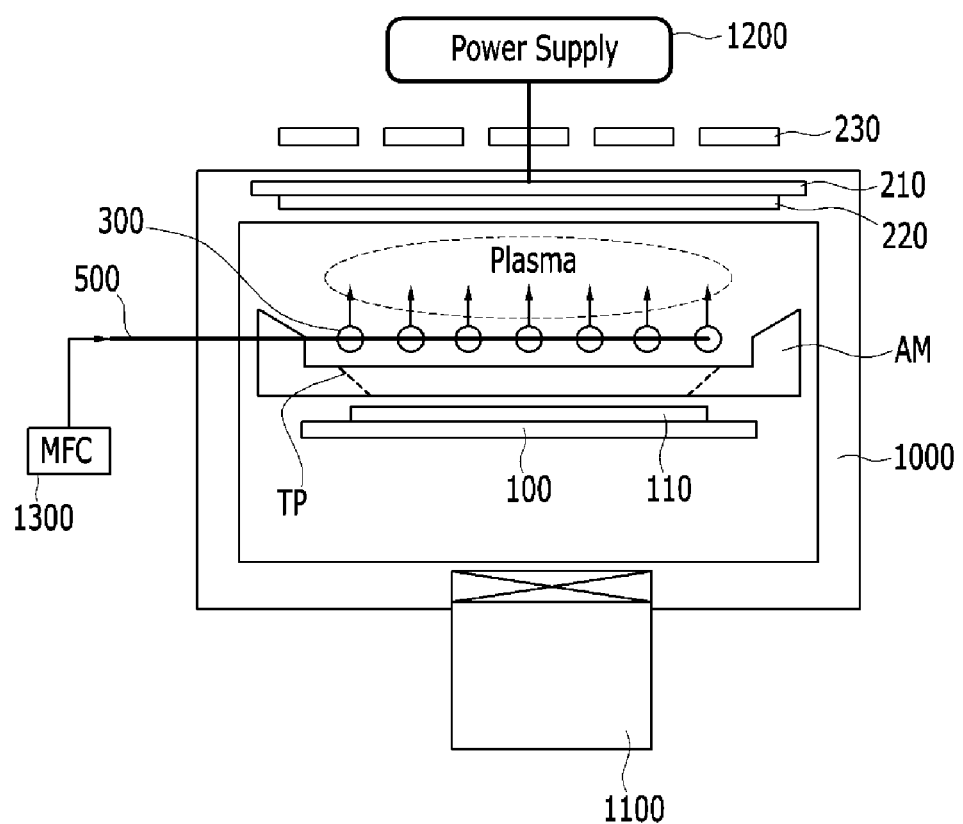
FIG. 1 is a cross-sectional view illustrating an exemplary embodiment of a sputtering device according to the invention.

Hereinafter, exemplary embodiments of the invention will be described in detail with reference to the accompanying drawings. As those skilled in the art would realize, the described embodiments may be modified in various different ways, all without departing from the spirit or scope of the invention. On the contrary, exemplary embodiments introduced herein are provided to make disclosed contents thorough and complete and sufficient transfer the spirit of the invention to those skilled in the art.

In the drawings, the thickness of layers, films, panels, regions, etc., are exaggerated for clarity. It will be understood that when a layer is referred to as being "on" another layer or substrate, it can be directly on the other layer or intervening them may also be present. As used herein, connected may refer to elements being physically, electrically and/or fluidly connected to each other. Like reference numerals designate like elements throughout the specification.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be described in detail with reference to the accompanying drawings.

Figure 2:
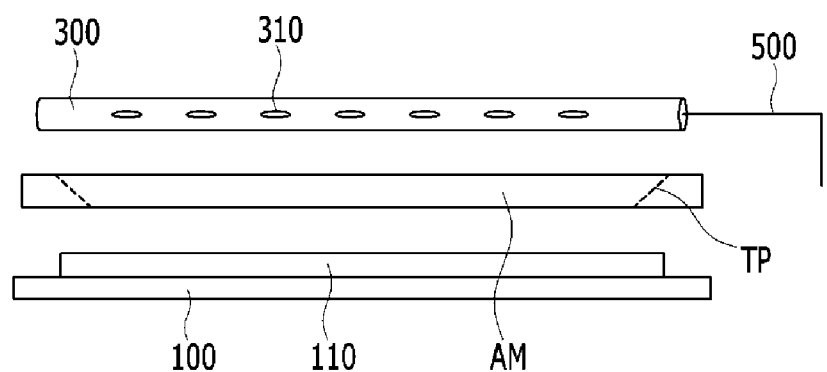
FIG. 2 is a partial lateral cross-sectional view of FIG. 1.
Figure 3:
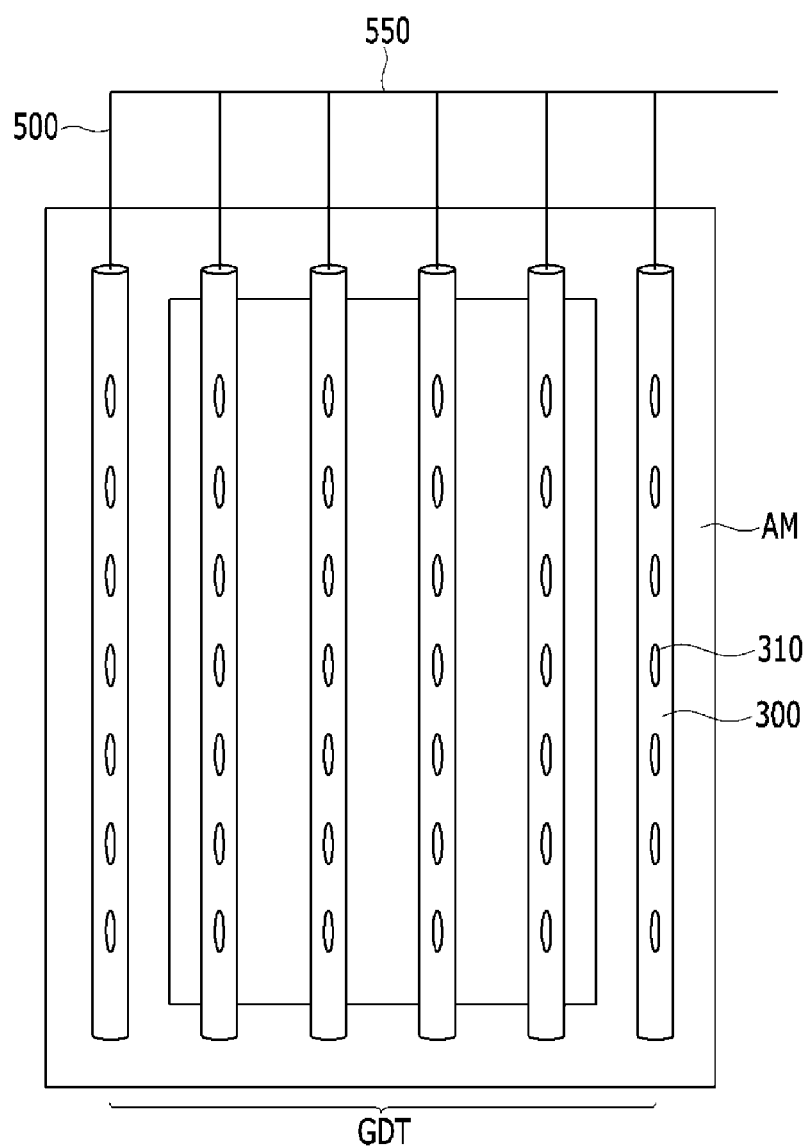
FIG. 3 is a plan view illustrating an exemplary embodiment of a portion of the elements of the sputtering device according to the invention.

FIG. 1 is a cross-sectional view illustrating an exemplary embodiment of a sputtering device according to the invention. FIG. 2 is a partial lateral cross-sectional view of FIG. 1. FIG. 3 is a plan view illustrating an exemplary embodiment of a portion of the elements of the sputtering device according to the invention.

Referring to FIGS. 1 to 3, an exemplary embodiment of a sputtering device according to the invention includes many elements for depositing a thin film in a vacuum chamber 1000. The vacuum chamber 1000 is configured to receive the sputtering device.

The exemplary embodiment of the sputtering device includes a substrate supporter 100 upon which a substrate 110 is disposed, and a sputtering target 220 which faces the substrate 110 and includes a target material as a material to be deposited on the substrate 110. The substrate supporter 100 may be configured to move the substrate 110 in or out of the vacuum chamber 1000, and/or to fix the substrate 110 at a position within the vacuum chamber 1000. In addition, the sputtering device includes a power supply 1200 supplying a power so that the sputtering target 220 becomes a negative electrode, and a gas supplier (not illustrated) for supplying a discharge gas and reaction gas in the vacuum chamber 1000. Here, the substrate 110 may rotate within the vacuum chamber 1000.

Further, an anode mask AM is disposed between the substrate 110 and the sputtering target 220. The anode mask AM functions as a shield member such that a desired portion of the substrate 110 thereunder may be sputtered while a discharging stability is maintained. The anode mask AM may include an opening defined therein. The opening may extend partially or completely through a thickness of the anode mask AM, and may expose a portion of the substrate 110. The opening may correspond to a transmitting region TP of the anode mask AM. The transmission region TP of the anode mask AM may correspond to or be aligned with a region of the substrate 110 upon which a thin film is to be deposited. The anode mask AM may be electrically independent from the sputtering target 220.

Here, the power supply 1200 may use a direct current ("DC") or an alternating current ("AC") power supply.

Additionally, a backing plate 210 may be disposed at a back side of the sputtering target 220. The backing plate 210 is an assembly upon which the sputtering target 220 is mounted and is connected with the power supply 1200. Cooling water (not shown) for cooling the sputtering target 210 flows within the backing plate 210. A wiring (not shown) for supplying the power from the power supply 1200 to the backing plate 210 is connected to the backing plate 210.

A plasma region is formed and defined between the sputtering target 210 and the substrate 110, as indicated by the dotted line circle in FIG. 1.

The sputtering target 220 may be opposite to the substrate 110, and may be rectangular or circular shaped. A vacuum pump 1100 for forming a vacuum state in the vacuum chamber 100 may be in or connected to the vacuum chamber 1000.

In the exemplary embodiment, a gas distribution tube GDT is disposed between the sputtering target 220 and the substrate 110. The gas distribution tube GDT may include a same metallic material as the anode mask AM. As illustrated in FIG. 3, a plurality of rod-shaped anode rods 300 is arranged separated from each other and substantially parallel to a horizontal surface (e.g., a plane) of the anode mask AM. The anode rods 300 may have a longitudinal axis which extends in a first direction, while being arranged in a second direction crossing the first direction. The first and second directions may define a plane parallel to the plane of the anode mask, and may be perpendicular to each other, but are not limited thereto or thereby.

An anode rod 300 includes a plurality of discharge holes 310 defined therein, and gas flows into the vacuum chamber 1000 through the discharge holes 310. The plurality of discharge holes 310 is defined along the anode rod 300 at intervals. The intervals at which the discharge holes 310 are defined along the anode rod 300 may be substantially regular and uniform so that the gas flowing therethrough is uniformly distributed in the vacuum chamber 1000. The gas distribution tube GDT may collectively include the plurality of anode rods 300, and may otherwise be referred to as a gas distribution member.

The gas distribution tube GDT may be connected with a mass flow meter ("MFC") 1300 through a nozzle line 500 connected to each of the anode rods 300, and the mass flow meter 1300 may be connected with a gas supplier (not shown). Further, the gas distribution tube GDT may be connected with the mass flow meter 1300 through a single guide line 550 connecting the plurality of nozzle lines 500 to each other. The mass flow meter 1300 serves to measure and control a quantity of the gas flowing into the vacuum chamber 1000.

When ions collide with the target material in the sputtering target 220 by plasma generation, atoms and molecules on the surface of the sputtering target 220 are discharged from the sputtering target 220 and attach to the substrate 110. The target material may include metal, ceramic, polymer or the like. The target material may be a solid state material or a powder state material.

After the vacuum state in the vacuum chamber 1000 is sufficiently discharged, argon gas and the like may be injected into the vacuum chamber 1000 so that the discharging of the atoms and molecules is generated.

As described above, the anode rod 300 has a relatively long and uniform width as the rod shape, but the anode rod 300 is limited thereto and the shape of the anode rod 300 may be modified in various shapes.

The plurality of discharge holes 310 defined in the anode rod 300 may face the sputtering target 220 as illustrated in FIGS. 1 and 3. Accordingly, the gas may be emitted toward the sputtering target 220 from the anode rod 300 to flow into the vacuum chamber 1000. The gas may be discharged through the plurality of discharge holes 310 substantially simultaneously. An entire of the plurality of discharge holes 310 may face the sputtering target 220, however, is not limited thereto. In an alternative exemplary embodiment, the plurality of discharge holes 310 defined in the anode rod 300 may face the substrate 110.

As another alternative exemplary embodiment, a first discharge hole may be defined in an anode rod 300 to face the sputtering target 220, and a second discharge hole may be defined in the same anode rod 300 to face the substrate 110 at the same time. As still another alternative exemplary embodiment, an entire of the plurality of discharge holes 310 may be defined in substantially a same horizontal surface (e.g., plane) of an anode rod 300, and a plurality of these anode rods 300 may be disposed such that the discharge holes 310 face both the substrate 110 and the sputtering target 220.

In sputtering a large-sized substrate, a sputtering device of the related art supplies reaction gas from one end nozzle of a gas injection pipe at one side of a vacuum chamber. Where a thin film is deposited on the large-sized substrate for use in a liquid crystal display by using the sputtering device of the related art, it is difficult to uniformly supply a gas atmosphere in a vacuum chamber where the thin film is deposited. Where the gas is non-uniformly supplied to the vacuum chamber, it is difficult to uniformly deposit the thin film on the substrate because the gas does not form a uniform gas atmosphere in the vacuum chamber. Particularly, in a reactive sputtering process in which an indium tin oxide ("ITO") thin film is deposited on a transparent electrode glass substrate by using oxygen gas, since the uniformity of the deposited thin film is largely influenced by the uniformity of the gas atmosphere defined by the supplied oxygen gas, a serious problem occurs.

However, in the exemplary embodiment of the invention, since the plurality of discharge holes 310 is uniformly arranged in the gas distribution tube GDT and the gas distribution tube GDT in the vacuum chamber 1000, particularly, between the substrate 110 and the sputtering target 220 corresponds to substantially an entire transmitting region TP of the anode mask AM, the reaction gas may be uniformly distributed in the vacuum chamber 1000 and/or to the substrate 110.

In the exemplary embodiment, a magnetron 230 may be disposed adjacent to and/or around the backing plate 210 in order to improve a deposition speed, and increase an ionization rate to improve the quality of the deposited thin film. The magnetron 230 may include one or more magnet or magnetic coil which generates a magnetic field.

Figure 4:
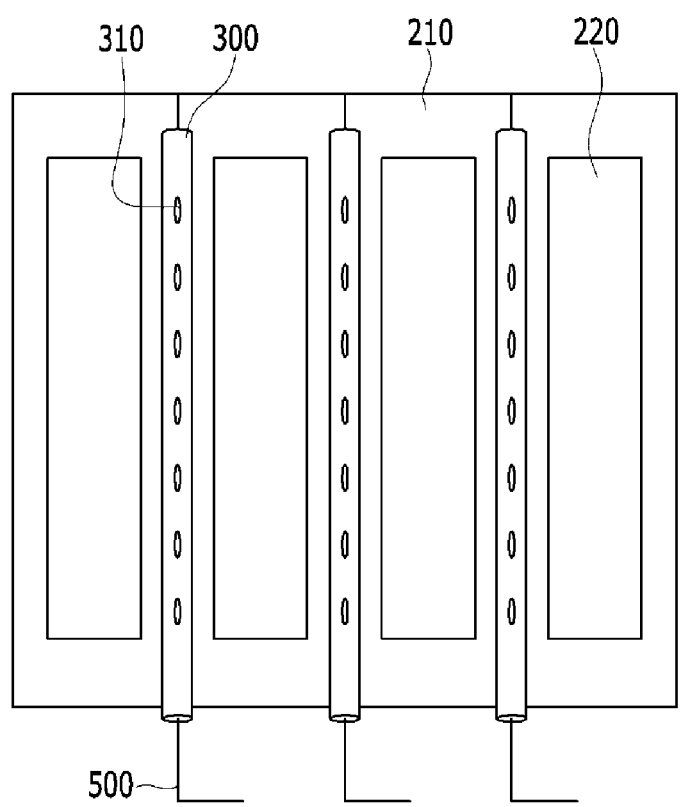
FIG. 4 is a plan view illustrating another exemplary embodiment of a portion of the elements of a sputtering device according to the invention.

FIG. 4 is a plan view illustrating another exemplary embodiment of a portion of the elements of a sputtering device according to the invention.

Referring to FIG. 4, in the exemplary embodiment, the sputtering device may include a plurality of discrete sputtering targets 220 on the backing plate 210 and separated from each other, in contrast to the single, unitary, indivisible sputtering target of the previous exemplary embodiment described above. Each of the discrete sputtering targets 220 may individually be a single, unitary, indivisible member, but is not limited thereto or thereby. As illustrated in FIG. 4, a plurality of anode rods 300 of a collective gas distribution tube GDT may be disposed between adjacent sputtering targets 220, respectively.

Any of the arrangements of the anode rods 300 and/or the plurality of discharge holes 310 described above may be applied to the exemplary embodiment shown in FIG. 4, but the invention is not limited thereto or thereby.

Figure 5:
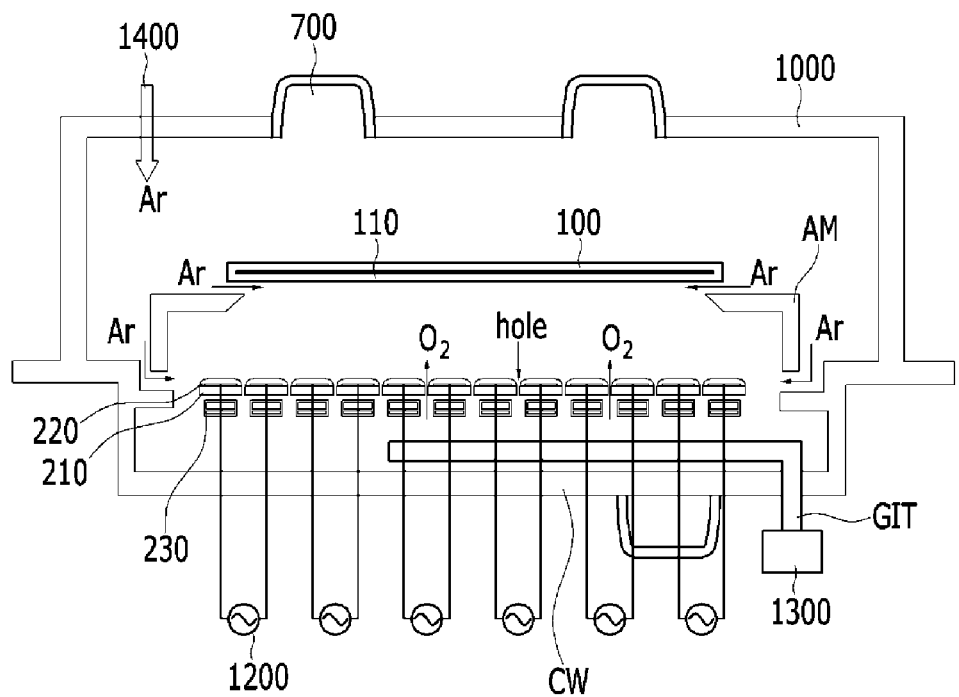
FIG. 5 is a cross-sectional view illustrating another exemplary embodiment of a sputtering device according to the invention.

FIG. 5 is a cross-sectional view illustrating another exemplary embodiment of a sputtering device according to the invention.

Referring to FIG. 5, in the exemplary embodiment of a sputtering device, a plurality of discrete sputtering targets 220 is in the vacuum chamber 1000, and the substrate supporter 100 and the substrate 110 are disposed at a position opposite to the plurality of sputtering targets 220. Further, a plurality of vacuum pumps 700 may be in fluid, electrical and/or physical communication with the vacuum chamber 1000 to form a vacuum in the vacuum chamber 1000.

A plurality of discrete backing plates 210 is positioned on the back side of the plurality of sputtering targets 220, and a plurality of magnetrons 230 are arranged at the back side of the plurality of backing plates 210. The magnetrons 230 may be aligned with the sputtering targets 220 respectively on the backing plates 210, but are not limited thereto or thereby. Each of the sputtering targets 220 is connected to a power supply 1200.

A plurality of holes is defined between adjacent sputtering targets 220. The holes may be uniformly arranged in the vacuum chamber 1000 and correspond to substantially an entire of a reaction space between the sputtering targets 220 and the substrate 110.

A single gas injection tube GIT is disposed in a space defined between a barrier CW of the vacuum chamber 1000, which is positioned on the back side of the sputtering targets 220, and the magnetrons 230. The gas injection tube GIT is in communication with the space defined between the barrier CW and the magnetrons 230. The gas injection tube GIT is connected to a mass flow meter 1300 and a gas supplier (not shown). The mass flow meter 1300 and/or the gas supplier may be outside the vacuum chamber 1000, but is not limited thereto or thereby. A reaction gas is injected into the space between the barrier CW of the vacuum chamber 1000 and the magnetrons 230, through the gas injection tube GIT. The injected reaction gas is further injected into the reaction space between the sputtering targets 220 and the substrate 110 through the plurality of holes defined between adjacent sputtering targets 220 among the plurality of sputtering targets 220, as illustrated by the "O2" with arrows extended through holes in FIG. 5. The gas may be discharged through the plurality of holes defined between adjacent sputtering targets 220 substantially simultaneously.

Argon gas and the like for generating plasma may flow into the vacuum chamber 1000 through a gas inlet 1400, in addition to the gas injection tube GIT which may be considered a gas inlet. The argon gas may flow around and into the reaction space between the sputtering targets 220 and the substrates 110, as illustrated by the "Ar" with arrows in FIG. 5.

In the exemplary embodiment of the invention, since the plurality of holes is uniformly arranged in the vacuum chamber 1000 and corresponds to substantially an entire of a reaction space between the sputtering targets 220 and the substrate 110, the reaction gas may be uniformly distributed in the vacuum chamber 1000.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A sputtering device, comprising:
   a sputtering target;
   a substrate supporter facing the sputtering target and upon which a substrate is disposed;
   an anode mask between the sputtering target and the substrate which is on the substrate supporter, in a cross-sectional direction; and
   a gas distribution member which is disposed between the anode mask and the sputtering target to overlap the sputtering target in the cross-sectional direction in which the anode mask is disposed between the sputtering target and the substrate, the gas distribution member comprising a plurality of gas distribution tubes separated from each other,
   wherein each gas distribution tube comprises a plurality of discharge holes defined therein and through which gas is discharged to a vacuum chamber configured to receive the sputtering device.

2. The sputtering device of claim 1, wherein:
   the plurality of discharge holes is parallel to a plane of the anode mask.

3. The sputtering device of claim 2, wherein:
   the plurality of gas distribution tubes comprise a plurality of rods separated from and parallel to each other.

4. The sputtering device of claim 3, wherein:
   the plurality of discharge holes faces the substrate.

5. The sputtering device of claim 3, wherein:
   the plurality of discharge holes faces the sputtering target.

6. The sputtering device of claim 3, wherein:
   the plurality of discharge holes comprises a first discharge hole facing the sputtering target and a second discharge hole facing the substrate.

7. The sputtering device of claim 1, wherein:
   the gas discharge member is connected with a mass inflow meter.

8. The sputtering device of claim 1, further comprising a plurality of sputtering targets separated from each other,
   wherein the plurality of gas distribution tubes is respectively between adjacent sputtering targets.

9. The sputtering device of claim 1, wherein:
   the gas discharged from the plurality of gas distribution tubes and to the vacuum chamber comprises a reaction gas which is deposited on the substrate after reacting with a material of the sputtering target.

10. The sputtering device of claim 9, wherein:
    the reaction gas comprises oxygen or nitrogen.

11. The sputtering device of claim 1, further comprising:
    a plurality of magnetrons on the sputtering target and generating a magnetic field.

12. The sputtering device of claim 11, wherein:
    the plurality of gas distribution tubes comprises a metal material.

13. The sputtering device of claim 1, wherein the plurality of gas discharge holes discharges the gas to the vacuum chamber substantially simultaneously.

14. A sputtering device, comprising:
    a plurality of sputtering targets spaced apart from each other to respectively define a hole between adjacent sputtering targets;
    a substrate supporter facing the plurality of sputtering targets, and upon which a substrate is disposed;
    an anode mask between the plurality of sputtering targets and the substrate which is on the substrate supporter; and
    a gas injection tube which discharges gas therefrom to a space defined between a vacuum chamber barrier at a back side of the plurality of sputtering targets, and the sputtering targets,
    wherein
    the plurality of sputtering targets is interposed between the substrate supporter and the gas injection tube in a cross-sectional direction, and the gas discharged to the space defined between the vacuum chamber barrier at the back side of the plurality of sputtering targets, and the sputtering targets, is injected from the space into a reaction space between the sputtering targets and the substrate, through the hole defined by the plurality of sputtering targets spaced apart from each other.

15. The sputtering device of claim 14, wherein:

the gas injection tube is connected with a mass inflow meter which is outside the vacuum chamber barrier.

16. The sputtering device of claim 15, further comprising:

a plurality of magnetrons on the back side of the plurality of sputtering targets.

17. A method of depositing a thin film by sputtering, the method comprising:

providing a substrate on which the thin film is to be deposited, in a vacuum chamber;

providing a sputtering target facing the substrate, in the vacuum chamber;

providing an anode mask between the sputtering target and the substrate in a cross-sectional direction;

providing a gas distribution member which is disposed between the anode mask and the sputtering target to overlap the sputtering target in the cross-sectional direction in which the anode mask is disposed between the sputtering target and the substrate, the gas distribution member comprising a plurality of discharge holes defined therein and through which a gas is discharged to the vacuum chamber, in communication with the vacuum chamber.

18. The method of claim 17, wherein the gas distribution member comprises a plurality of gas distribution tubes between the anode mask and the sputtering target, wherein the plurality of discharge holes is defined in the plurality of gas distribution tubes, and the plurality of gas distribution tubes comprises a same material as the anode mask.

19. The method of claim 17, further comprising providing a plurality of sputtering targets facing the substrate, wherein the plurality of discharge holes of the gas distribution member is defined between adjacent sputtering targets.

20. The method of claim 17, wherein the anode mask comprises a gas transmitting region, and further comprising depositing the gas discharged to the vacuum chamber, on the substrate, after the gas reacts with a material of the sputtering target and passes through the gas transmitting region of the anode mask.

* * * * *